US009419412B2

(12) United States Patent
Krishnamurthy et al.

(10) Patent No.: US 9,419,412 B2
(45) Date of Patent: Aug. 16, 2016

(54) INTEGRATED LASER AND METHOD OF FABRICATION THEREOF

(71) Applicant: Agency for Science, Technology and Research, Singapore (SG)

(72) Inventors: Vivek Krishnamurthy, Singapore (SG); Qian Wang, Singapore (SG); Jing Pu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 23 days.

(21) Appl. No.: 14/540,143

(22) Filed: Nov. 13, 2014

(65) Prior Publication Data

US 2015/0132002 A1 May 14, 2015

(30) Foreign Application Priority Data

Nov. 13, 2013 (SG) .............................. 201308414-0

(51) Int. Cl.
*H04B 10/00* (2013.01)
*H01S 5/0625* (2006.01)
*H01S 5/40* (2006.01)
*H04J 14/02* (2006.01)
(Continued)

(52) U.S. Cl.
CPC ........... *H01S 5/06255* (2013.01); *H01S 5/1007* (2013.01); *H01S 5/1032* (2013.01); *H01S 5/142* (2013.01); *H01S 5/4087* (2013.01); *H04B 10/503* (2013.01); *H04J 14/02* (2013.01); *H01S 5/021* (2013.01); *H01S 5/026* (2013.01); *H01S 5/0215* (2013.01); *H01S 5/0607* (2013.01); *H01S 5/06256* (2013.01); *H01S 5/1014* (2013.01); *H01S 5/1025* (2013.01); *H01S 5/14* (2013.01)

(58) Field of Classification Search
USPC .................................................. 398/182–201
See application file for complete search history.

(56) References Cited

U.S. PATENT DOCUMENTS 6,330,378 B1* 12/2001 Forrest ............... G02B 6/12002
372/50.21
6,381,380 B1* 4/2002 Forrest .................. B82Y 20/00
385/14

(Continued)

OTHER PUBLICATIONS

Wang et al., "Silicon/III-V Laser with Super-Compact Diffraction Grating for WDM Applications in Electronic-Photonic Integrated Circuits," Optics Express 2006, vol. 19, No. 3, Jan. 31, 2011, pp. 2006-2013.

(Continued)

*Primary Examiner* — Agustin Bello
(74) *Attorney, Agent, or Firm* — Winstead, P.C.

(57) ABSTRACT

There is provided an integrated laser. The integrated laser includes a semiconductor waveguide having a first section, a second section and a third section. The integrated laser further includes an active region formed on the third section of the semiconductor waveguide, the active region configured for generating light, and a coupler formed on the second section of the semiconductor waveguide, the coupler configured for coupling said light between the semiconductor waveguide and the active region. In particular, the first section comprises a multi-branch splitter having a ring structure formed between two branches of the multi-branch splitter for emission wavelength control of the integrated laser. Preferably, the multi-branch splitter is a Y-branch splitter and the ring structure is formed in a space between two branches of the Y-branch splitter. There is also provided a method of fabrication thereof, an integrated tunable laser and an integrated tunable laser system.

21 Claims, 15 Drawing Sheets

(51) Int. Cl.
  *H04B 10/50* (2013.01)
  *H01S 5/10* (2006.01)
  *H01S 5/02* (2006.01)
  *H01S 5/026* (2006.01)
  *H01S 5/06* (2006.01)
  *H01S 5/14* (2006.01)

(56) References Cited

U.S. PATENT DOCUMENTS

| | | | | |
|---|---|---|---|---|
| RE37,809 E * | 7/2002 | Deacon | | H01S 3/063 372/102 |
| 6,600,847 B2 * | 7/2003 | Saini | | G02B 6/1228 372/43.01 |
| 6,665,476 B2 * | 12/2003 | Braun | | G02B 6/12002 385/14 |
| 6,714,566 B1 * | 3/2004 | Coldren | | H01S 5/026 372/20 |
| 6,819,814 B2 * | 11/2004 | Forrest | | B82Y 20/00 359/344 |
| 6,944,192 B2 * | 9/2005 | Prassas | | H01S 3/063 372/6 |
| 7,212,553 B2 * | 5/2007 | Starodoumov | | H01S 5/4062 372/4 |
| 7,230,963 B2 * | 6/2007 | Menon | | H01S 5/026 356/478 |
| 7,327,910 B2 * | 2/2008 | Forrest | | B82Y 20/00 372/43.01 |
| 7,400,797 B2 * | 7/2008 | Bhagavatula | | G02B 6/12007 372/94 |
| 7,551,826 B2 * | 6/2009 | Taylor | | G02B 6/1228 257/183 |
| 7,664,156 B2 * | 2/2010 | Yamazaki | | H01S 5/0612 372/34 |
| 7,664,157 B2 * | 2/2010 | Yamazaki | | H01S 5/0612 372/94 |
| 7,701,983 B2 * | 4/2010 | Suzuki | | G02B 6/12007 372/20 |
| 7,773,642 B2 * | 8/2010 | Yamazaki | | G02B 6/12004 372/20 |
| RE41,642 E * | 9/2010 | Libatique | | H01S 3/0675 372/102 |
| 8,005,123 B2 * | 8/2011 | Fukuda | | H01S 5/026 372/20 |
| 8,064,490 B2 * | 11/2011 | Okayama | | G02B 6/29355 372/20 |
| 8,422,530 B2 * | 4/2013 | Yoon | | H01S 5/026 372/26 |
| 8,467,122 B2 * | 6/2013 | Zheng | | H01S 5/142 359/333 |
| 8,488,637 B2 * | 7/2013 | Fukuda | | B82Y 20/00 372/20 |
| 8,620,120 B2 * | 12/2013 | Baets | | G01D 5/268 385/14 |
| 8,643,943 B2 * | 2/2014 | Todt | | H01S 5/0264 359/333 |
| 8,737,446 B2 * | 5/2014 | Fukuda | | H01S 5/026 372/43.01 |
| 8,902,937 B2 * | 12/2014 | Yoon | | H01S 3/10 372/102 |
| 9,020,001 B2 * | 4/2015 | Doerr | | H01S 5/125 372/44.01 |
| 9,077,152 B2 * | 7/2015 | Ben Bakir | | H01S 5/1032 |
| 9,130,350 B2 * | 9/2015 | Jeong | | H01S 5/142 |
| 9,184,865 B2 * | 11/2015 | Akiyama | | G02F 1/0147 |
| 2002/0085595 A1 * | 7/2002 | Ksendzov | | H01S 5/141 372/20 |
| 2003/0219045 A1 * | 11/2003 | Orenstein | | H01S 5/06255 372/20 |
| 2004/0258360 A1 * | 12/2004 | Lim | | B82Y 20/00 385/43 |
| 2005/0025419 A1 * | 2/2005 | Fish | | G02B 6/12004 385/31 |
| 2006/0013273 A1 * | 1/2006 | Menon | | H01S 5/026 372/32 |
| 2006/0274802 A1 * | 12/2006 | Aoki | | B82Y 20/00 372/45.01 |
| 2009/0059973 A1 * | 3/2009 | Suzuki | | H01S 5/142 372/20 |
| 2009/0092159 A1 * | 4/2009 | Kato | | H01S 5/026 372/20 |
| 2009/0122817 A1 * | 5/2009 | Sato | | G02B 6/12007 372/20 |
| 2009/0154505 A1 * | 6/2009 | Oh | | G02B 6/12007 372/20 |
| 2010/0034224 A1 * | 2/2010 | Takabayashi | | H01S 5/141 372/20 |
| 2011/0310918 A1 * | 12/2011 | Yoon | | H01S 5/026 372/26 |
| 2012/0189025 A1 * | 7/2012 | Zheng | | H01S 5/1071 372/20 |
| 2013/0083815 A1 * | 4/2013 | Fang | | H01S 5/026 372/20 |
| 2015/0132002 A1 * | 5/2015 | Krishnamurthy | | H01S 5/06255 398/79 |

OTHER PUBLICATIONS

Keyvaninia et al., "Demonstration of a Heterogeneously Integrated III-V/SOI Single Wavelength Tunable Laser," Optics Express 3784, vol. 21, No. 3, Feb. 11, 2013, pp. 3784-3792.

* cited by examiner

FIG. 4B   FIG. 4C

INTEGRATED LASER AND METHOD OF FABRICATION THEREOF

CROSS-REFERENCE TO RELATED APPLICATION

This application claims the benefit of priority of Singapore Patent Application No. 201308414-0, filed Nov. 13, 2013, the contents of which being hereby incorporated by reference in its entirety for all purposes.

TECHNICAL FIELD

The present invention generally relates to an integrated laser and a method of fabrication thereof. Various embodiments also relate an integrated tunable laser and an integrated tunable laser system.

BACKGROUND

Recent growing interest in silicon photonics owes to the well-established CMOS (Complementary-Metal-Oxide-Semiconductor) manufacturing base for silicon-based chips and the need for photonics-based energy efficient technology. In addition to low-cost foundry base, silicon is transparent to light transmission at wavelengths used for telecommunication and data communication and has a high refractive index, allowing confinement of modes in sub-micron dimensions. Hence, silicon is a good candidate for energy-efficient micro- and nano-photonic applications.

However, one disadvantage of silicon is that it is an indirect bandgap material. Hence, silicon cannot be used to emit light. Therefore, heterogeneous integration of direct bandgap material such as III-V-based alloys on silicon via direct bonding or interlayer bonding is one way of realizing laser-on-silicon. In heterogeneously integrated hybrid III-V/SOI-based lasers, the optical field is generated in the III-V region and is coupled to the silicon layer. In the silicon layer, the passive devices are patterned to provide different functionalities such as waveguiding, reflection, filtering or modulation to the optical field. The silicon processing steps for patterning passive devices together with the heterogeneous integration of laser-on-silicon extend the scope of functionalities and complexity of the silicon photonics chip. This technique has already been used to realize various types of lasers such as Fabry-Perot laser, ring/disk lasers, multi-wavelength laser, tunable laser, and grating laser.

However, conventional lasers suffer from various deficiencies or problems. For example, there exists a conventional tunable laser which utilizes an electrically-pumped active medium aligned to mechanically-controlled gratings via lens system. By tuning the orientation of the gratings, the wavelength of the reflected optical field into the medium is tuned. This is because the beam sees varying periodicity of grating as a function of its orientation angle. Hence the wavelength with maximum reflection or the laser resonant wavelength changes, resulting in the laser emission at varying wavelength that is dependent on the orientation of the grating mirror. However, some disadvantages associated with this conventional tunable laser are: 1) since it depends on external diffraction grating and lens, it is not compact and integrate-able, 2) mechanical tuning is relatively slow (few milliseconds to seconds), 3) optical losses depends on strict alignment between lens and grating laser, and 4) packaging cost is high because of the usage of discrete elements such as lens and gratings.

There also exists an integrated version of grating laser-on-silicon that requires an active III-V medium heterogeneously integrated on silicon that is patterned with waveguide and gratings. The evanescently coupled optical field generated in electrically-pumped III-V-based active medium was guided in the silicon waveguide to the gratings. Although gratings reflected the optical field at a particular wavelength, since gratings was fabricated in silicon, it was not possible to tune the grating orientation. In addition, the footprint of the device was about 1 mm$^2$ which is relatively large. Therefore, grating laser may not be a good solution for integrated tunable lasers-on-silicon.

There has also been disclosed a tunable laser-on-silicon. A silicon-based micro-ring was integrated in the cavity along the round-trip path of the optical field, in such a way that it filtered and only allowed the lasing wavelength to complete the round trip path. The tuning of the lasing wavelength was realized by tuning the filter wavelength of the ring via heating. A long active medium was realized through heterogeneous integration of III-V on SOI via interlayer bonding. The structure is relatively compact, but requires distributed Bragg reflectors (DBRs) for unidirectional laser emission. Further, since the heterogeneous integration is based on interlayer bonding, a relatively complex 3-layer coupling mechanism of optical field between the SOI and the III-V-based active layers was adopted which results in increased fabrication complexity.

A need therefore exists to provide an integrated laser that seeks to overcome, or at least ameliorate, one or more of the deficiencies of the conventional lasers mentioned above. It is against this background that the present invention has been developed.

SUMMARY

According to a first aspect of the present invention, there is provided an integrated laser, comprising: a semiconductor waveguide having a first section, a second section and a third section; an active region formed on the third section of the semiconductor waveguide, the active region configured for generating light; and a coupler formed on the second section of the semiconductor waveguide, the coupler configured for coupling said light between the semiconductor waveguide and the active region, wherein the first section comprises a multi-branch splitter having a ring structure formed between two branches of the multi-branch splitter for emission wavelength control of the integrated laser.

Preferably, the multi-branch splitter is a Y-branch splitter and the ring structure is formed in a space between two branches of the Y-branch splitter.

Preferably, the active region comprises III-V material layers formed on the third section of the semiconductor waveguide.

The III-V material layers may include a single quantum well (SQW) or multiple quantum wells (MQW).

Preferably, the coupler is an adiabatic coupler.

Preferably, the adiabatic coupler has a tapered shape, tapering from an end adjacent the third section to an opposing narrower end adjacent the first section, and the adiabatic coupler comprises III-V material layers formed on the second section of the semiconductor waveguide.

Preferably, the first section of the semiconductor waveguide functions as a narrow-band back mirror for filtering the emission wavelength, and the third section of the semiconductor waveguide has a cleaved facet that functions as a broad-band front mirror.

Preferably, the first section of the semiconductor waveguide further comprises a tuning mechanism for modifying a property of the ring structure in order to tune the emission wavelength of the integrated laser.

The tuning mechanism may comprise one or more electrodes coupled to the ring structure for modifying the property of the ring structure through heating or carrier injection for causing a change in the refractive index of the ring structure so as to tune the resonant wavelength of the ring structure.

According to a second aspect of the present invention, there is provided an integrated tunable laser system, the system comprising: a plurality of integrated lasers, each integrated laser comprising: a semiconductor waveguide having a first section, a second section and a third section; an active region formed on the third section of the semiconductor waveguide, the active region configured for generating light; and a coupler formed on the second section of the semiconductor waveguide, the coupler configured for coupling said light between the semiconductor waveguide and the active region, wherein the first section comprises a multi-branch splitter having a ring structure formed between two branches of the multi-branch splitter for emission wavelength control of the integrated laser, and a wavelength de-multiplexing (WDM) element interfaced with a waveguide for combining laser light emitted by each of the plurality of integrated lasers, wherein the ring structures of the plurality of integrated lasers have different radii, each ring structure having a radius configured for tuning the emission wavelength of the respective integrated laser within a predetermined range of emission wavelengths.

Preferably, each integrated laser is coupled in series with a respective ring modulator for converting an output of the integrated laser into an optical data.

Preferably, each ring modulator is configured to have a predetermined number of resonant dips over an emission tuning range, and the system is configured for accommodating m×n optical channels, where m is the predetermined number of resonant dips of said each ring modulator and n is the number of integrated lasers in the system.

According to a third aspect of the present invention, there is provided a method of fabricating an integrated laser, comprising: forming a semiconductor waveguide having a first section, a second section and a third section; forming an active region on the third section of the semiconductor waveguide, the active region configured for generating light; and forming a coupler on the second section of the semiconductor waveguide, the coupler configured for coupling said light between the semiconductor waveguide and the active region, wherein the first section comprises a multi-branch splitter having a ring structure formed between two branches of the multi-branch splitter for emission wavelength control of the integrated laser.

Preferably, the multi-branch splitter is a Y-branch splitter and the ring structure is formed in a space between two branches of the Y-branch splitter.

Preferably, forming the active region comprises forming III-V material layers on the third section of the semiconductor waveguide.

The III-V material layers may include a single quantum well (SQW) or multiple quantum wells (MQW).

Preferably, the coupler is an adiabatic coupler.

Preferably, forming the coupler comprises forming the adiabatic coupler having a tapered shape, tapering from an end adjacent the third section to an opposing narrower end adjacent the first section, and forming the adiabatic coupler comprising III-V material layers on the second section.

Preferably, the first section of the semiconductor waveguide functions as a narrow-band back mirror for filtering the emission wavelength, and the third section of the semiconductor waveguide has a cleaved facet that functions as a broad-band front mirror.

Preferably, the method further comprises forming a tuning mechanism at the first section of the semiconductor waveguide for modifying a property of the ring structure in order to tune the emission wavelength of the integrated laser.

BRIEF DESCRIPTION OF THE DRAWINGS

Embodiments of the present invention will be better understood and readily apparent to one of ordinary skill in the art from the following written description, by way of example only, and in conjunction with the drawings, in which:

FIG. 4B illustrates the central cross-section of the spatial profile of the optical field coupling between the silicon waveguide and the active III-V region according to the example embodiment of FIG. 4A;

FIG. 4C illustrates the optical mode profile in the active III-V region after the light has been coupled from the silicon waveguide to the active III-IV region according to the example embodiment of FIG. 4A;

DETAILED DESCRIPTION

Embodiments of the present invention provide an integrated laser that seeks to overcome, or at least ameliorate, one or more of the deficiencies of the conventional lasers mentioned in the background. For example, in an example embodiment, there is disclosed a heterogeneously integrated laser-on-silicon that does not require Distributed Bragg Reflectors (DBRs) for unidirectional laser emission as well as being compact and simple in structure. Embodiments of the present invention also provide an integrated tunable laser and an integrated tunable laser system as well as a method of fabricating the integrated laser. It will be appreciated that the embodiments described herein can be modified in various aspects without deviating from the essence of the present invention.

Figure 1:
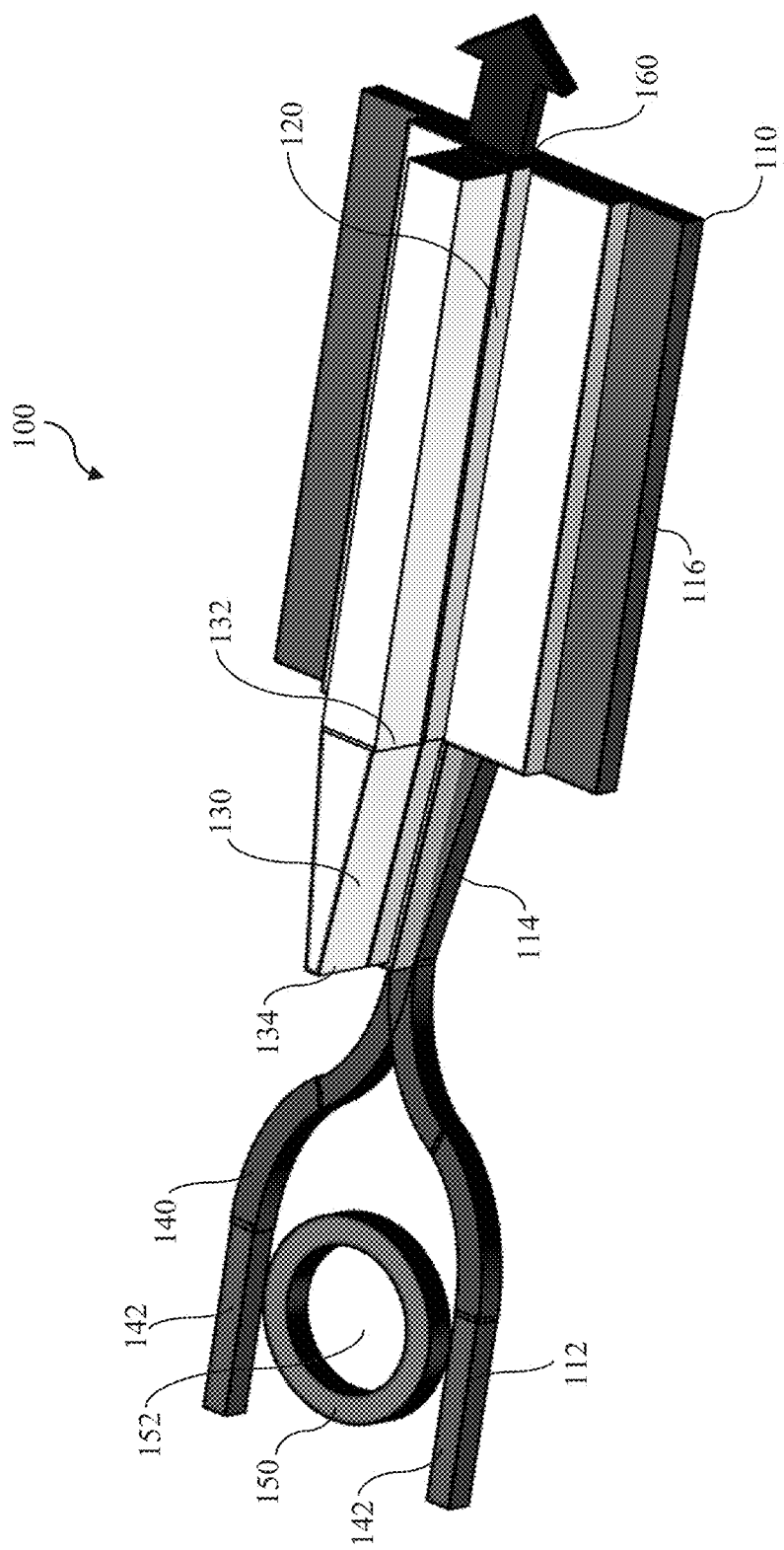
FIG. 1 depicts a schematic diagram of an integrated laser according to an embodiment of the present invention.

FIG. 1 depicts a schematic diagram of an integrated laser 100 according to an embodiment of the present invention. The integrated laser 100 comprises a semiconductor waveguide 110 having a first section 112, a second section 114 and a third section 116. The integrated laser 100 further comprises an active region 120 formed on the third section 116 of the semiconductor waveguide 110, the active region 120 being configured for generating or operable to generate light, and a coupler 130 formed on the second section 114 of the semiconductor waveguide 110, the coupler 130 configured for coupling or operable to couple the light between the semiconductor waveguide 110 and the active region 120. In particular, in the embodiment, the first section 112 comprises a multi-branch splitter 140 having a ring structure 150 formed between two branches 142 of the multi-branch splitter 140 for emission wavelength control of the integrated laser 100. Implementing and configuring the multi-branch splitter 140 in such a manner advantageously enable the integrated laser 100 with emission wavelength control and unidirectional emission, without requiring DBRs while having a simpler structure with a smaller footprint.

In a preferred embodiment, the multi-branch splitter 140 is a Y-branch splitter as illustrated in FIG. 1. The ring structure 150 is formed in a space 152 between the two branches 142. In other embodiments, the multi-branch splitter 140 may be a four-branch splitter or of higher order as appropriate. Preferably, the ring structure 150 is a silicon micro-ring.

For a better understanding of the present invention, the integrated laser 100 as described above with reference to FIG. 1 will now be described in further details, including specific materials/elements and structures/configurations according to various embodiments of the present invention. Although the specific materials/elements and configurations described hereinafter may be preferred in certain embodiments of the present invention, it will be appreciated to a person skilled in the art that the present invention is not limited as such, and other materials/elements and structures/configurations may be used as appropriate without deviating from the scope of the present invention.

In an example embodiment, the integrated laser 100 is configured as a III-V/SOI heterogeneously integrated laser-on-silicon 100. In particular, the semiconductor waveguide 110 is a silicon waveguide and the active region 120 comprises III-V material layers formed on the third section 116 of the semiconductor waveguide 110. For example, the III-V material layers may include a single quantum well (SQW) or multiple quantum wells (MQW). Preferably, the coupler 130 is an adiabatic coupler. As shown in FIG. 1, the adiabatic coupler 130 has a tapered shape, tapering from an end 132 adjacent the third section 116 to an opposing narrower end 134 adjacent the first section 112 of the semiconductor waveguide 110. In the example embodiment, the adiabatic coupler 130 comprises III-V material layers formed on the second section 114 of the semiconductor waveguide 110. The adiabatic coupler 130 advantageously allows efficient transfer of light between the active III-V region 120 and the silicon waveguide 110, and reduces the internal optical loss of the laser 100. In addition, in contrast to the conventional evanescently coupled laser that does not incorporate a coupler, incorporating the adiabatic coupler 130 enables an improvement in the confinement of optical field in the active III-V region 120. This may reduce the threshold current and improves the efficiency of the laser 100.

In the example embodiment, the first section 112 may be referred to as the emission wavelength control section, the second section 114 may be referred to as the coupler section, and the third section 116 may be referred to as the active medium section. The wavelength control section 112, the coupler section 114 and the active medium section 116 are arranged and interfaced with one another as shown in FIG. 1. In particular, the coupler section 114 is situated between the wavelength control section 112 and the active medium section 116 so as to couple light between the emission wavelength control section 112 and the active III-V region 120 at the active medium section 116.

The active medium section 116 is integrated in between the laser cavity that consists of a cleaved silicon waveguide facet 160 (which acts as a front mirror, i.e., a broad-band front mirror) and the silicon micro-ring 150 embedded in a Y-branch splitter 140 (which acts as a back mirror, i.e., narrow-band back mirror). In the example embodiment, the dimension of the micro-ring mirror 150 is designed such that it reflects just one wavelength in the gain spectrum. Further, since the micro-ring 150 has a high Q-factor, it is highly reflective resulting in the unidirectional laser emission through the cleaved facet 160. This is highly advantageous as single wavelength and unidirectional emission improves the efficiency of the laser.

Figure 2A:
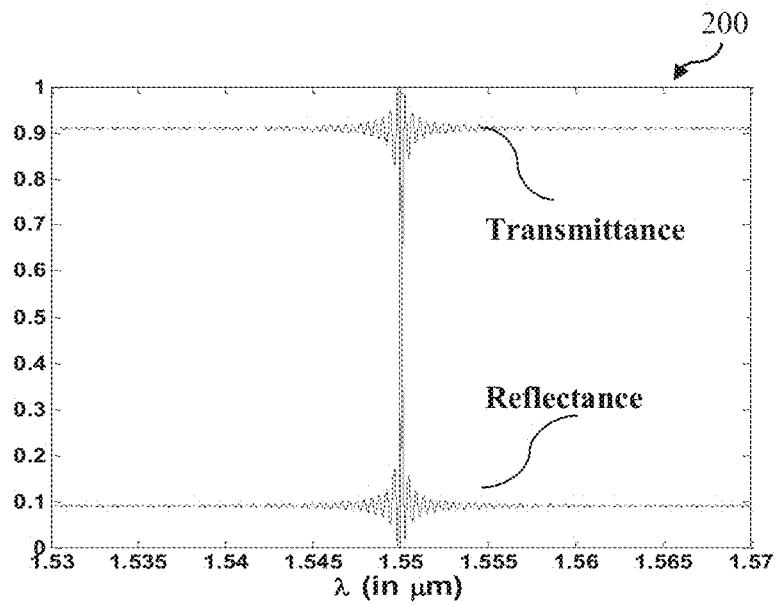
FIGS. 2A and 2B depict the spectral response and the reflectance spectra of the laser cavity, respectively, according to an example embodiment of the present invention.
Figure 2B:
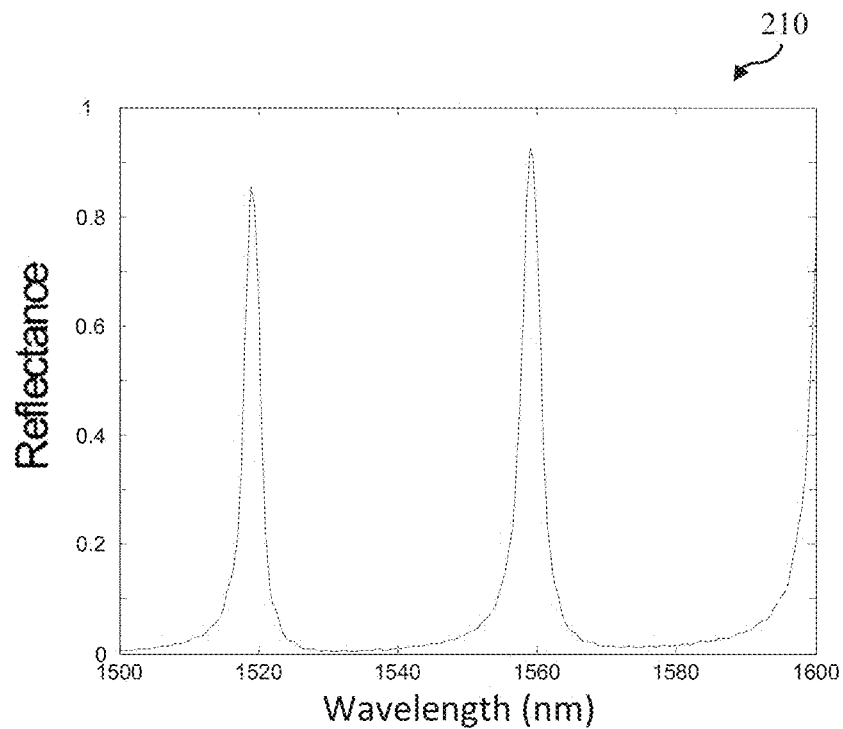
Figure 3A:
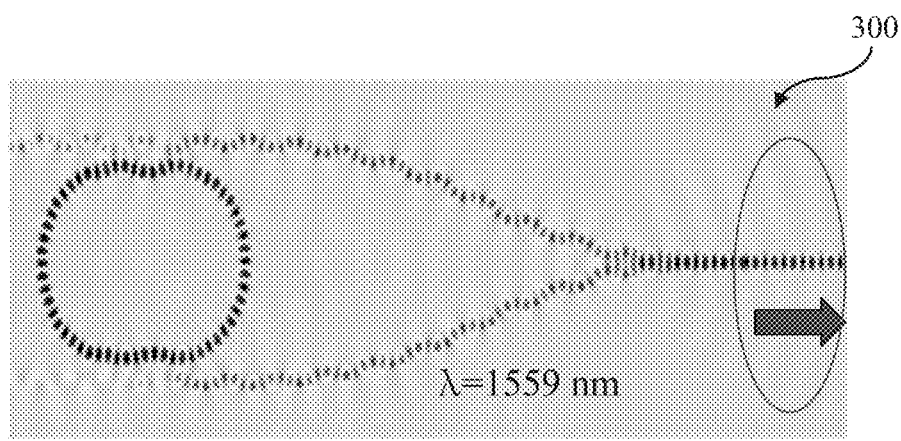
FIGS. 3A and 3B depict the spatio-temporal simulation of the micro-ring embedded within the Y-branch splitter at resonant wavelength and at non-resonant wavelength, respectively, according to an example embodiment of the present invention.
Figure 3B:
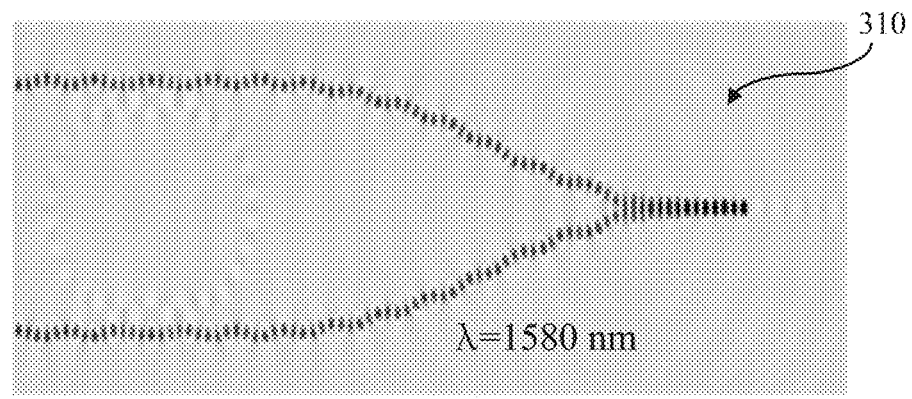

FIG. 2A depicts the analytically-calculated spectral response 200 of the laser cavity consisting of cleaved waveguide facet 160 and micro-ring 150, and FIG. 2B depicts the reflectance spectra 210 thereof. Further, through spatio-temporal simulation, FIG. 3A shows that at resonant wavelength (e.g., 1559 nm) the reflection 300 is high in the form of constructively interfered strong returning beam, while FIG. 3B shows that at non-resonant (e.g., 1580 nm) wavelength the reflection 310 is much lower and hence the returning beam is weak. This demonstrates the wavelength selective/filtering ability of the micro-ring 150 embedded within the Y-branch splitter 140.

Figure 4A:
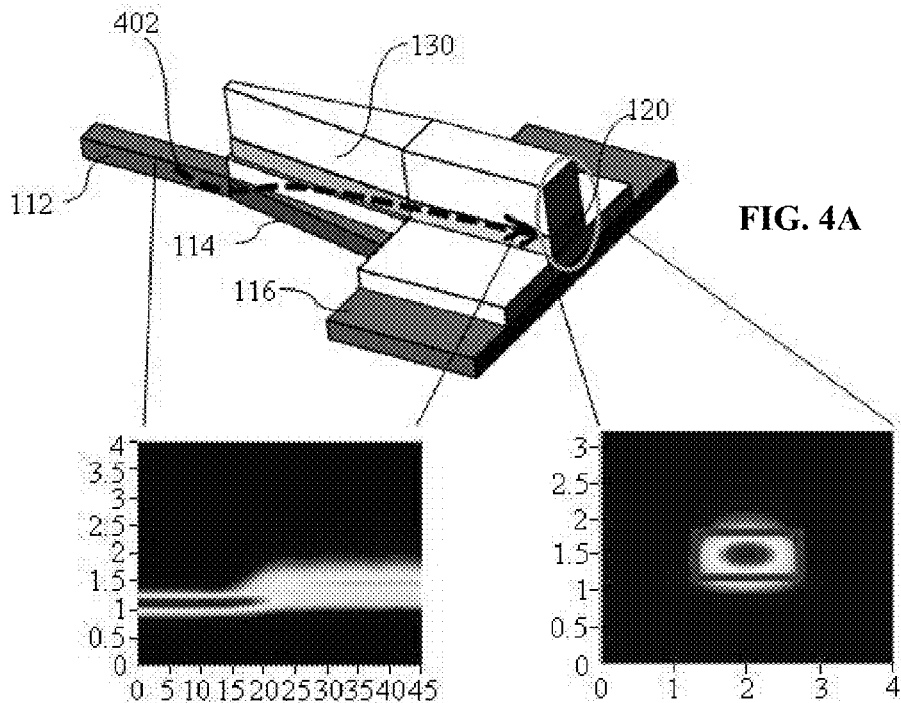
FIG. 4A schematically illustrates the path of light coupled by the adiabatic coupler from the silicon waveguide to the active III-V region according to an example embodiment of the present invention.
Figure 4D:
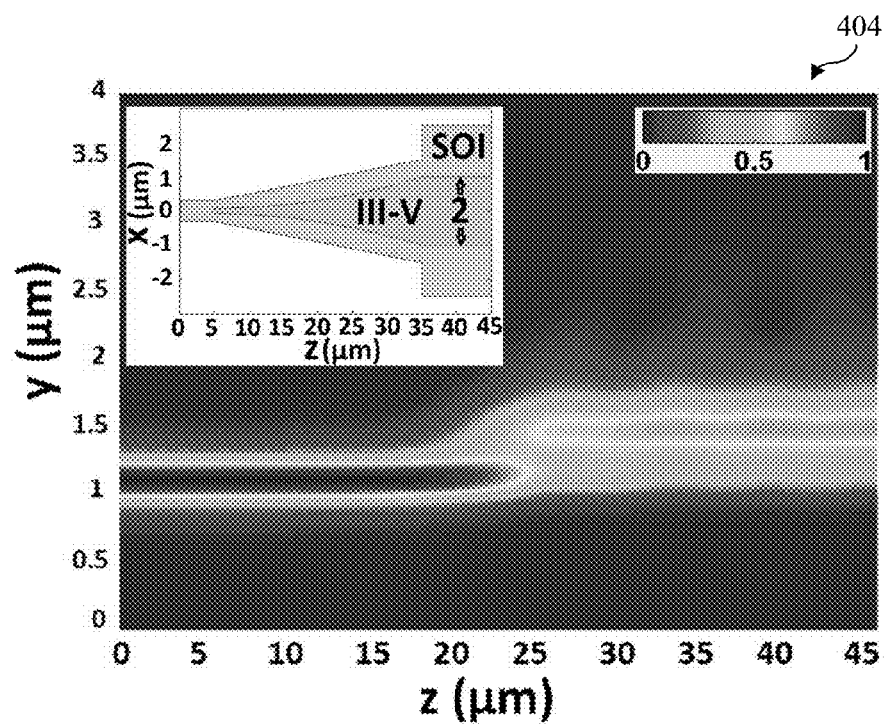
FIG. 4D depicts an enlarged view of the spatial profile of FIG. 4B, along with an exemplary cross-sectional dimension of the adiabatic coupler.

For illustration purposes only, FIG. 4A schematically shows a path 402 of light coupled by the adiabatic coupler 130 from the silicon waveguide 110 to the active III-V region 120. FIG. 4B shows the central cross-section of the spatial profile of the optical field coupling between the silicon waveguide 110 and the active III-V region 120, and FIG. 4C shows the optical mode profile in the active III-V region 120 after the light has been coupled from the silicon waveguide 110 to the active III-IV region 120. This demonstrates the efficient optical field coupling ability of the adiabatic coupler 130 between the silicon waveguide 110 and the active III-V region 120. FIG. 4D depicts an enlarged view 404 of FIG. 4B, along with an exemplary cross-sectional dimension of the adiabatic coupler 130 for illustration purposes only.

Therefore, the integrated laser 100 according to the example embodiment is based on a compact micro-ring 150 embedded in a Y-branch splitter 140 that acts as a strong narrow-band back-mirror for unidirectional emission through the cleaved facet 160. Advantageously, the integrated laser 100 according to the example embodiment does not require DBRs for unidirectional emission and employs a simpler 2-layer adiabatic taper 130 for coupling the optical field between the silicon (e.g., SOI) waveguide 110 and the active III-V region 120.

Figure 5:
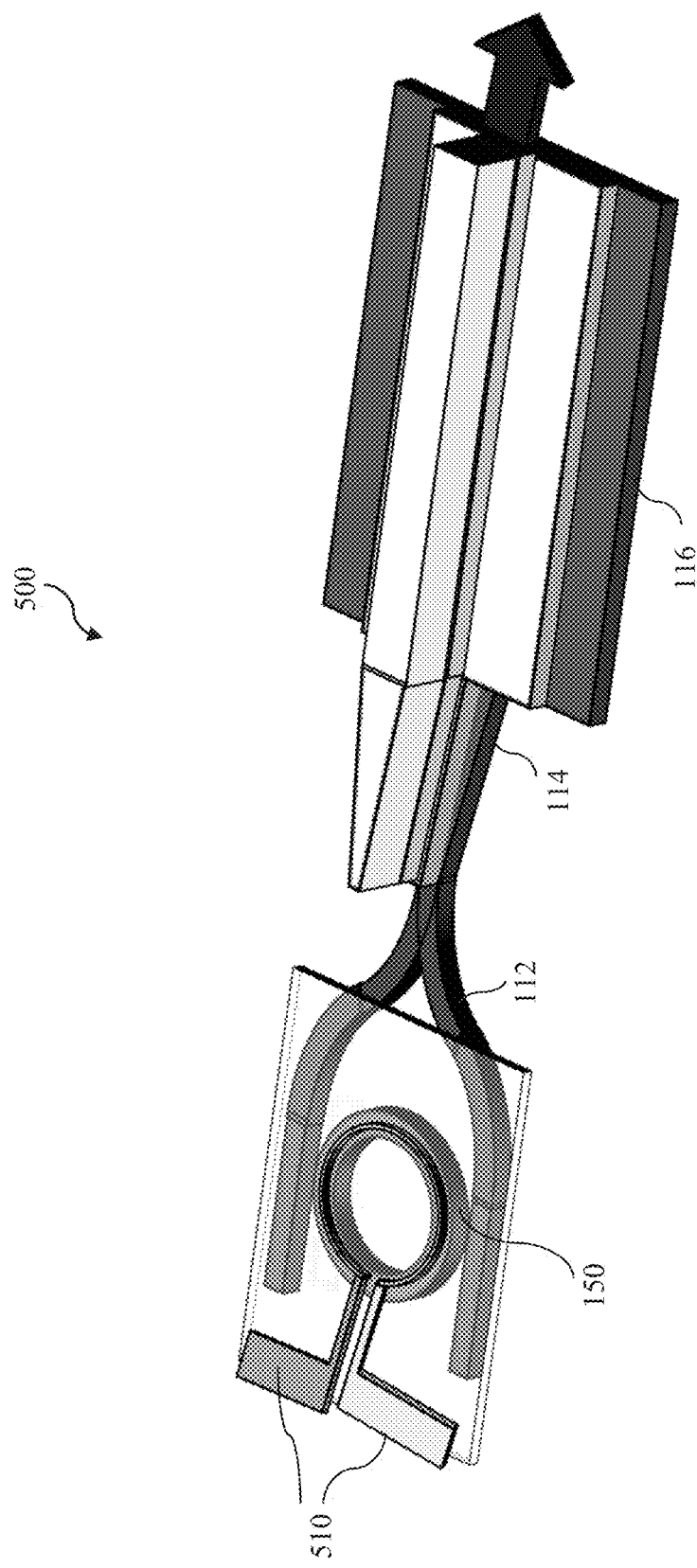
FIG. 5 illustrates a schematic diagram of an integrated tunable laser according to an embodiment of the present invention.

FIG. 5 illustrates a schematic diagram of an integrated tunable laser 500 according to an embodiment of the present invention obtained by incorporating a tuning mechanism 510 in the first section (emission wavelength control section) 112 of the integrated laser 100 shown in FIG. 1. In particular, the first section 112 of the semiconductor waveguide further comprises a tuning mechanism for modifying a property of the ring structure 150 in order to tune the emission wavelength of the laser 500. In a preferred embodiment, the tuning mechanism 510 is a resonant wavelength tuning mechanism for tuning the resonant wavelength of the micro-ring 150 which thus tune the emission wavelength of the integrated laser 500. Preferably, but not limiting, the resonant wavelength tuning mechanism 510 may comprise one or more electrodes (preferably two electrodes as shown in FIG. 5) coupled to the ring structure 150 for modifying the property (e.g., resonant wavelength) of the micro-ring 510 through heating or carrier injection. In particular, the injection of current through the electrodes 510 causes the refractive index of the micro-ring 150 to change, either through heating or through carrier injection-based nonlinearities. Accordingly, by tuning the refractive index of the micro-ring 150, the wavelength of the reflected optical beam can be shifted, thus allowing the emission wavelength of the integrated laser 500 to be controlled and tuned.

By incorporating the tuning functionality in the integrated laser 500, this advantageously circumvents the tuning burden on other elements such as modulator, filters and switches, and hence improves the energy efficiency of the integrated laser 500.

Figure 6:
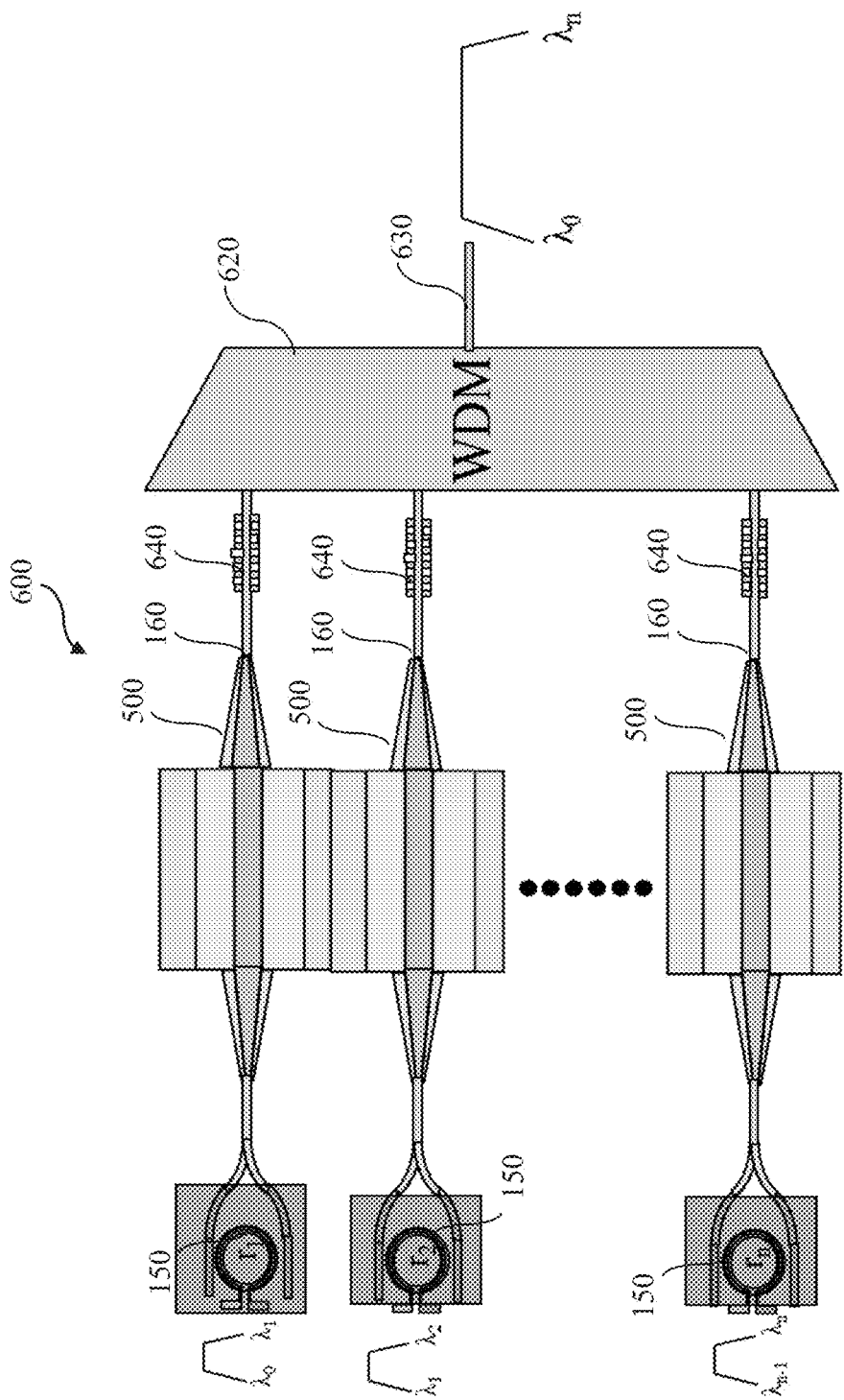
FIG. 6 illustrates a schematic diagram of an integrated tunable laser system according to an embodiment of the present invention.

FIG. 6 illustrates a schematic diagram of an integrated tunable laser system 600 according to an embodiment of the present invention obtained by integrating a plurality of tunable lasers 500 with varying ring structure radii ($r_1, r_2, \ldots r_n$) on a single chip. In particular, the integrated tunable laser system 600 comprises a plurality of integrated lasers 500, and a wavelength de-multiplexing (WDM) element 620 interfaced with a single waveguide 630 for combining laser light emitted by each of the plurality of integrated lasers 500, whereby the ring structures 150 of the plurality of integrated lasers 500 have different radii, each ring structure 150 having a radius determined for tuning the emission wavelength of the respective integrated laser within a predetermined range of emission wavelengths. Preferably, the plurality of integrated lasers 500 have complementary range of tuning wavelengths interfaced into a single waveguide 630 through a WDM element for extending the tuning range of the integrated laser 600. By combining all the laser outputs into a single waveguide 630 using a WDM element 620 (e.g., an array waveguide gratings, Mach-Zehnder interferometers, or micro-rings), the tunable range of the integrated laser 600 output through the waveguide 630 can be extended significantly for applications such as spectroscopy and sensing in the fields of aerospace, military, and medicine for example.

By way of example, as illustrated in FIG. 6, the emission wavelength of the first integrated laser 500 in the integrated laser system 600 may be configured to be tunable in the range of $\lambda_0$ to $\lambda_1$, the next laser 500 may be configured to be tunable in the range of $\lambda_1$ to $\lambda_2$, and so on until the last laser 500 which may be configured to be tunable in the range of $\lambda_{n-1}$ to $\lambda_n$. Therefore, as a whole, the emission wavelength of the integrated laser system 600 is advantageously tunable in the range of $\lambda_0$ to $\lambda_n$.

In the example embodiment, the cleaved facet 160 can be used as the front reflector or DBR 640 can be coupled to the respective integrated laser 500 in series as shown in FIG. 6 to act as the front reflector.

Figure 7:
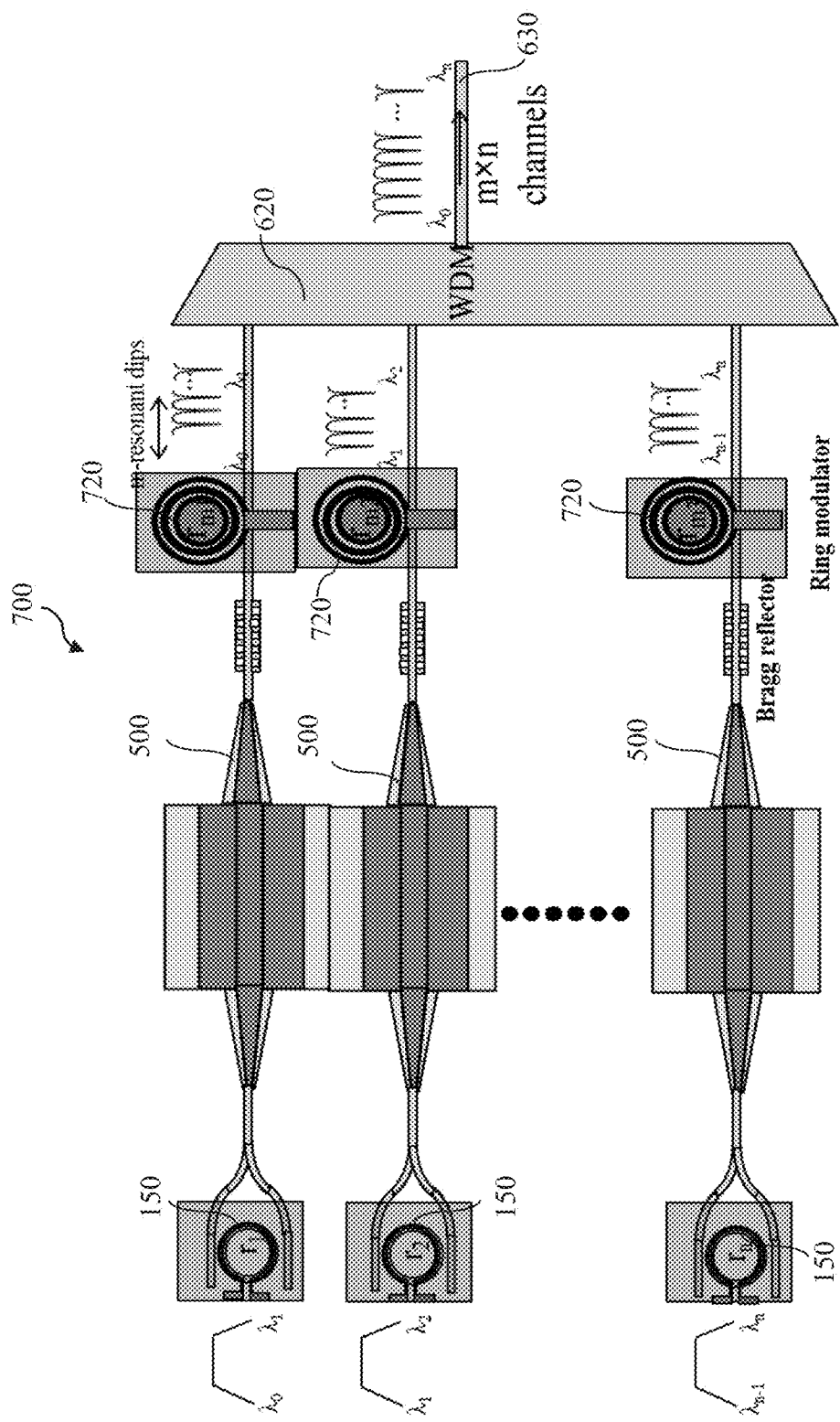
FIG. 7 illustrates a schematic diagram of an integrated tunable laser system.

FIG. 7 illustrates a schematic diagram of an integrated tunable laser system 700 configured as an optical transmitter according to an embodiment of the present invention. In particular, the chip 600 with multiple tunable lasers 500 interfaced to a single waveguide 630 through a WDM element 620 as schematically depicted in FIG. 6 is converted to an optical transmitter through the integration of modulators 720 as schematically depicted in FIG. 7. In an example embodiment, the modulators 720 are resonance enhanced ring-modulators as shown in FIG. 7 and are coupled in series (i.e., cascading) with the respective tunable lasers 500 for converting electrical data into optical data. Since the laser emission wavelength of the integrated tunable laser 500 is tunable as described hereinbefore, it can be tuned to the resonant wavelength of the respective modulator 720. Although the ring-modulator 720 is narrow-band, since it is integrated with the integrated tunable laser 500, the feasibility of the design is not compromised and simultaneous exploitation of the resonance enhancement of the modulator ring cavity can be implemented to significantly reduce the energy consumption compared to conventional MZI-based modulators. Also, the size of the ring-modulators 720 can be more than about 10 times smaller than MZI-based modulators.

In an example embodiment, in order to increase the data bandwidth of the integrated tunable laser system 700, the number of resonant dips over the laser tuning range is designed by choosing an appropriate value of the modulator radius ($r_{m1}, r_{m2}, \ldots, r_{mn}$). For example, if each modulator ring 720 is configured to accommodate 'm' resonant dips, then each physical channel may accommodate 'm' optical channels. Accordingly, if there are 'n' tunable lasers 500 respectively coupled with the modulators 720, then the aggregate number of channels that the laser chip 700 can accommodate is 'm×n' as shown in FIG. 7. This advantageously increases the bandwidth of the laser chip 700 significantly for optical interconnect application and makes the laser chip 700 a large bandwidth optical transmitter.

Figure 8:
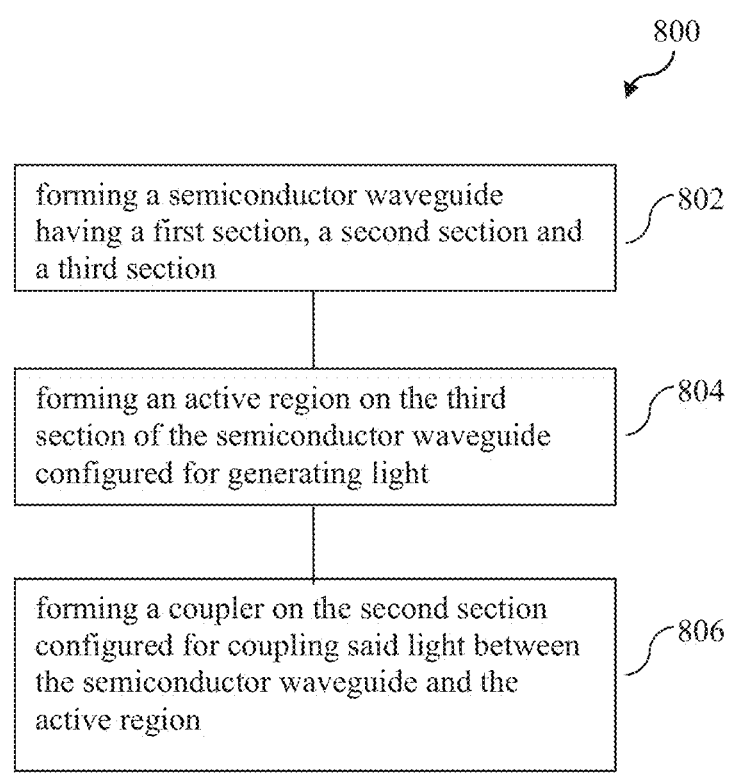
FIG. 8 depicts an overview of a method of fabricating an integrated laser according to an embodiment of the present invention.

FIG. 8 depicts an overview of a method 800 of fabricating an integrated laser 100 according to an embodiment of the present invention. The method 800 comprises a step 802 of forming a semiconductor waveguide 110 having a first section 112, a second section 114 and a third section 116, a step 804 of forming an active region 120 on the third section 116 of the semiconductor waveguide 110, the active region 120 configured for generating or operable to generate light, and a step 806 of forming a coupler 130 on the second section 114 of the semiconductor waveguide 110, the coupler 130 configured for coupling or operable to couple said light between the semiconductor waveguide 110 and the active region 120. In particular, the first section 112 comprises a multi-branch splitter 140 having a ring structure 150 formed between two branches 142 of the multi-branch splitter 140 for emission wavelength control of the integrated laser 100. As described hereinbefore, in a preferred embodiment, the multi-branch splitter 140 is a Y-branch splitter. It will be appreciated to a person skilled in the art that the above-described steps are not limited to the order presented and may be performed in another order as appropriate. Furthermore, the above steps are not intended to be construed to necessitate individual steps and may be combined as one fabrication step where appropriate without deviating from the scope of the present invention.

Figure 9:
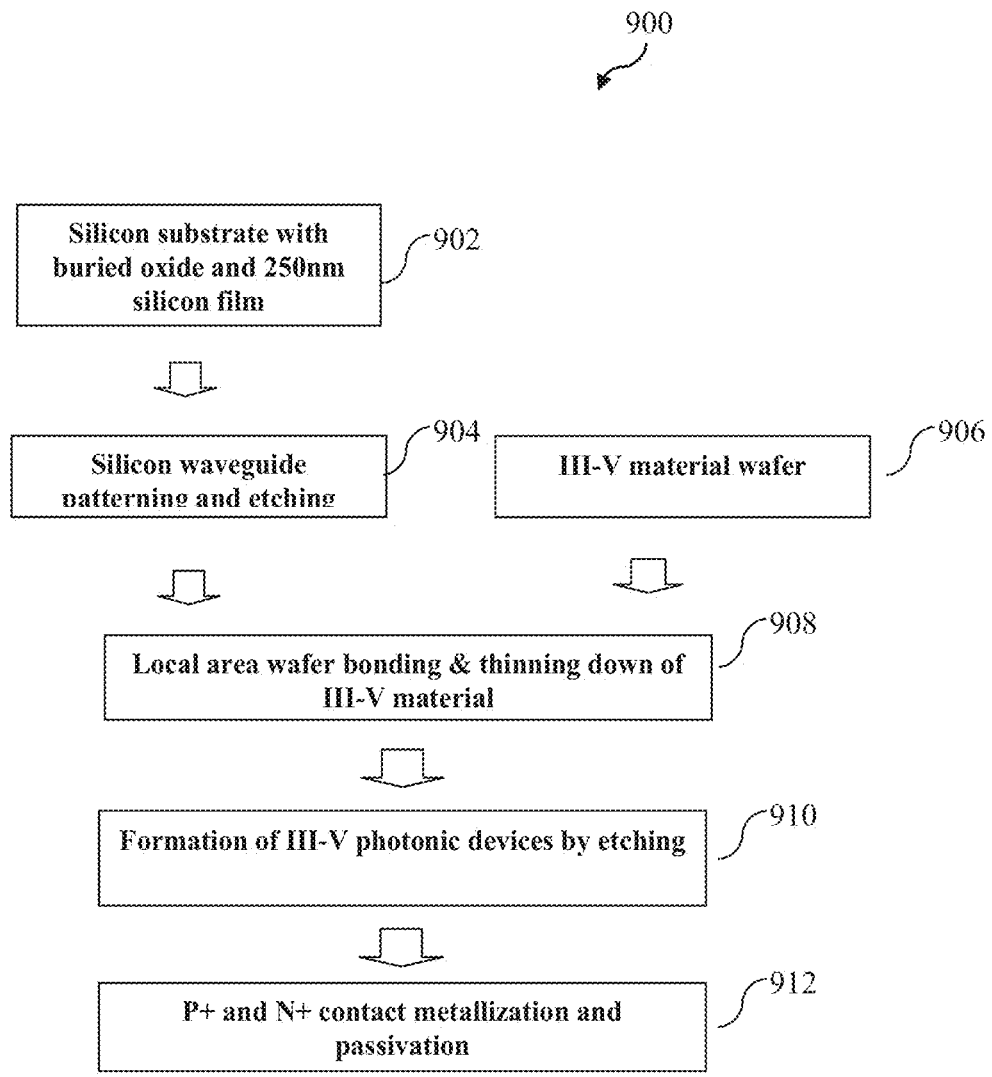
FIG. 9 depicts an overview of a method of fabricating an integrated laser according to an example embodiment of the present invention.

For a better understanding of the present invention, a method of fabricating an III-V/SOI integrated laser-on-silicon 100 will now be described in detail according to an example embodiment of the present invention. An overview of the fabrication process is illustrated in FIG. 9, which includes the preparation of the silicon substrate 110 (steps 902, 904, 906), local-area wafer bonding and thinning down of the III-V material (step 908), formation/shaping of active III-V layers on silicon by etching (step 910), and P+ and N+ contact metallization and passivation (step 912). The detailed fabrication process steps will now be described with reference to FIGS. 10A to 10I.

Figure 10A:
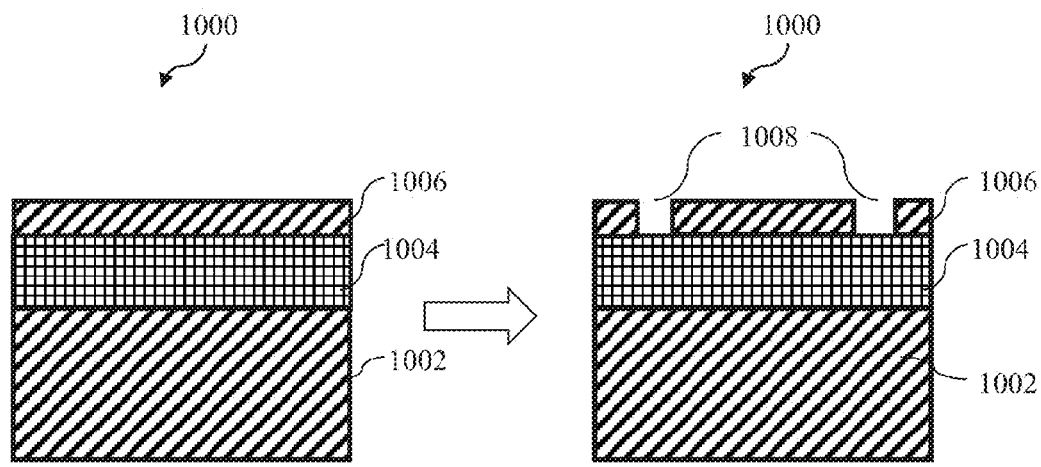
FIGS. 10A to 10I depict schematic diagrams of various steps in the fabrication method of FIG. 9.

FIG. 10A is a schematic illustration of the preparation of the silicon substrate 110 (corresponding to steps 902 and 904). The starting silicon wafer 1000 includes a bulk silicon substrate 1002, a silicon dioxide layer 1004 having a thickness of, e.g., about 2 um, and a silicon layer 1006 having a thickness of, e.g., about 250 nm on top of the oxide layer 1004. For the patterning and etching process, a 200-300 nm silicon dioxide layer (not shown) is first deposited by PECVD on the wafer 1000 as a hard mask material. The wafer 1000 is then patterned by E-beam Lithography to produce a desired silicon waveguide pattern 1008. The hard mask and the silicon waveguide 1006 are etched subsequently by RIE and ICP etching. After removing the photoresist and hard mask, the silicon waveguide is formed as shown in FIG. 10A.

Figure 10B:
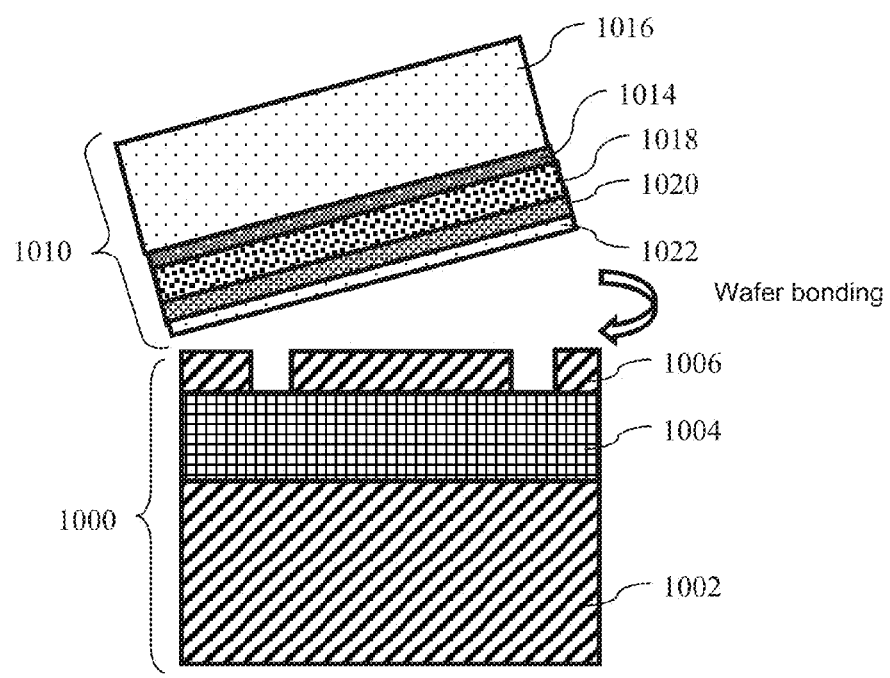

FIG. 10B is a schematic illustration of the formation of the III-V material wafer 1010, and the local area wafer bonding of the III-V material 1010 on the silicon wafer 1000 (corresponding to steps 906 and 908). In particular, the active III-V material 1010 includes a first contact layer 1014 (e.g., a p-contact layer which also functions as a first etch stop layer) grown on a substrate 1016, a cladding layer (not shown) formed on the first contact layer 1014, and then the active layers (including optical confinement layer) 1018 grown on the cladding layer. For example, the active layers 1018 may include a multiple quantum well layer (MQW) and a separate confinement heterostructure (SCH) layer 1020. Thereafter, a second contact layer 1022 (e.g., an n-contact layer which also functions as a second etch stop layer) is disposed on the active layers 1018. It will be appreciated to a person skilled in the art that other structures may be implemented for the active III-V medium 1010 as desired.

Figure 10C:
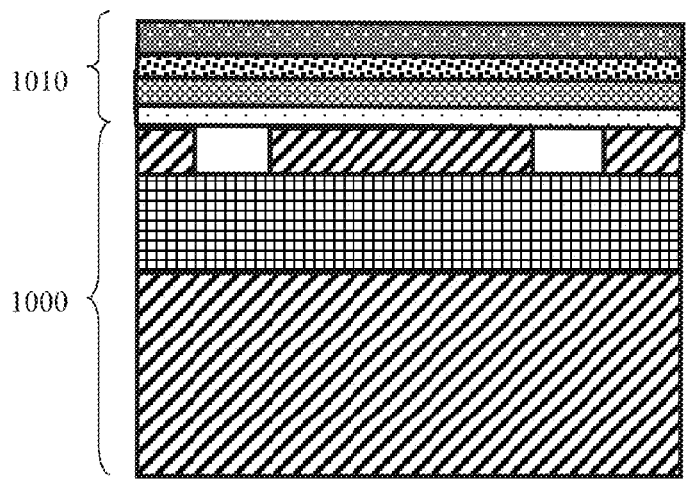

Subsequently, the III-V wafer 1010 and the silicon wafer 1000 are cleaned, preferably employing cleaning processes that are suitable for the material composition of each substrate. In this regard, cleaning processes usually render the surface hydrophilic. Once cleaned, as illustrated in FIG. 10B, the two wafers 1000, 1010 are brought in contact and bonded at room temperature by bonding the second contact layer 1022 to the silicon waveguide 1006. In this regard, pressure can be applied to the wafers 1000, 1010 manually or through any suitable apparatus, such as conventional wafer bonding machines. If necessary, the bonding pair may also be subjected to a heat treatment such as annealing to improve the bond strength. The annealing can be done at low temperature to minimize introducing defects in the film and avoid causing the film to fracture or separate. The InP substrate 1016 is then removed in a solution of HCl: $H_2O$ (1:1). This selective etch is designed to stop at the etch stop layer 1014. The bonded wafers 1000, 1010 with the bulk InP substrate 1016 removed are schematically illustrated in FIG. 10C.

Figure 10D:
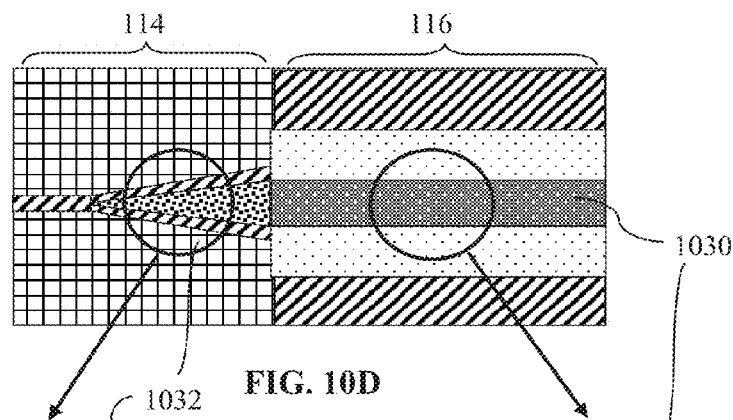
Figure 10E:
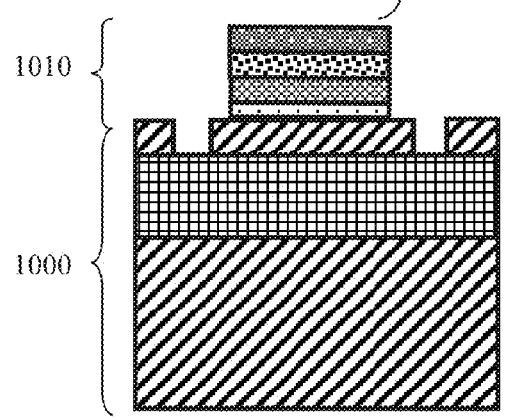

FIGS. 10E and F are schematic illustrations of the III-V patterning and etching to form or shape the III-V medium 1010 at the active medium section 116 and the coupler section 114 (corresponding to step 910). In particular, after bulk InP substrate 1016 removal, the bonded III-V material 1010 is patterned and etched subsequently to define the active III-V medium region 1030 and the III-V tapered region 1032. In this process, for example, a 300 nm $SiO_2$ is deposited as the hard mask (not shown) and E-beam lithography is used to pattern the III-V material 1010. The alignment accuracy of the III-V material to the silicon waveguide 1006 beneath is preferably in the range of 100 nm or less. After E-beam writing and hardmask etching, the III-V material 1010 is etched by applying ICP etching method. As an example, the gas chemistry used for this step is a mixture of $Cl_2$, $CH_4$ and $H_2$, and the etching rate may be in the range of 500-800 nm/min.

Figure 10F:
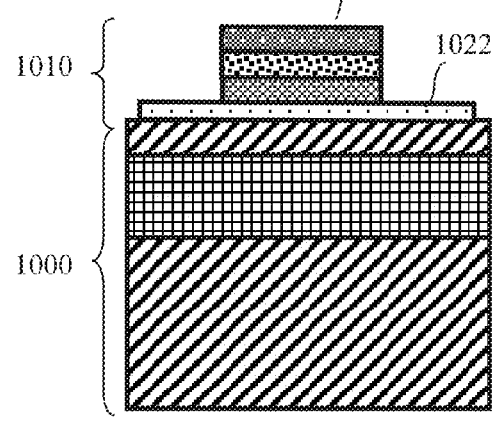

In contrast to conventional fabrication methods, according to the embodiment, the III-V tapered region 1032 and the active III-V medium region 1030 are etched separately, that is, a two-step III-V etching. In the III-V tapered region 1032, portions of the III-V material 1010 are removed to define the tapered shape (e.g., elongated triangular cross-section) as shown in FIG. 10D and the etching is stopped at the silicon waveguide 1006 as shown in FIG. 10E. This is to ensure the high coupling efficiency of the top-down coupler. In the active III-V medium region 1030, the etching is stopped at the second contact layer 1022 as shown in FIG. 10F. This is for the metal contact material to sit on top of the second contact layer 1022 and to provide electrical pumping current to the laser 100. The top view of the coupler section 114 and the active medium section 116 of the integrated laser 100 after completing the two-step III-V etching is schematically illustrated in FIG. 10D.

Figure 10G:
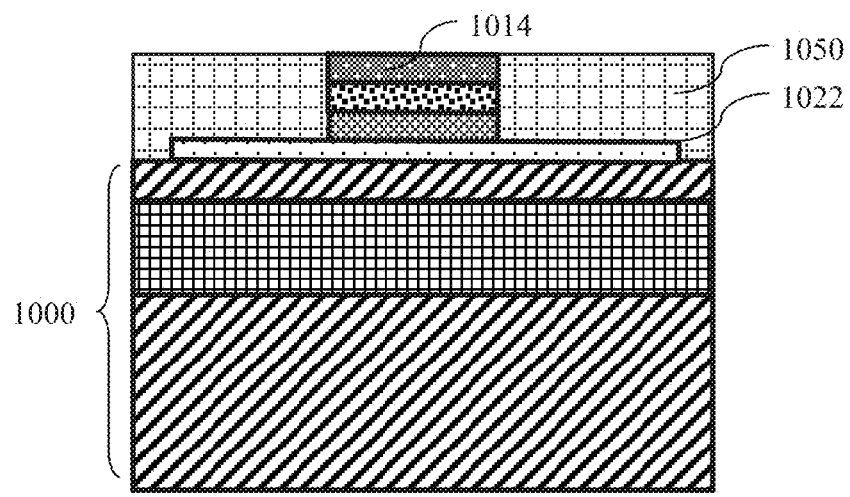
Figure 10H:
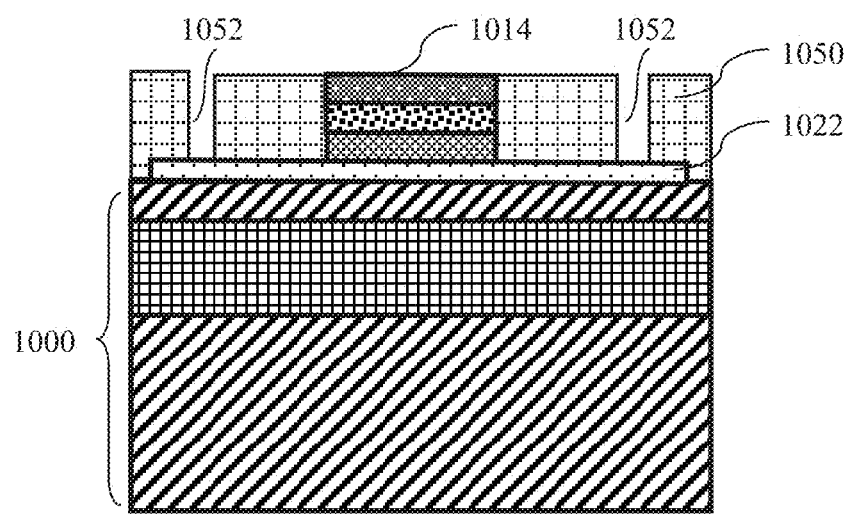
Figure 10I:
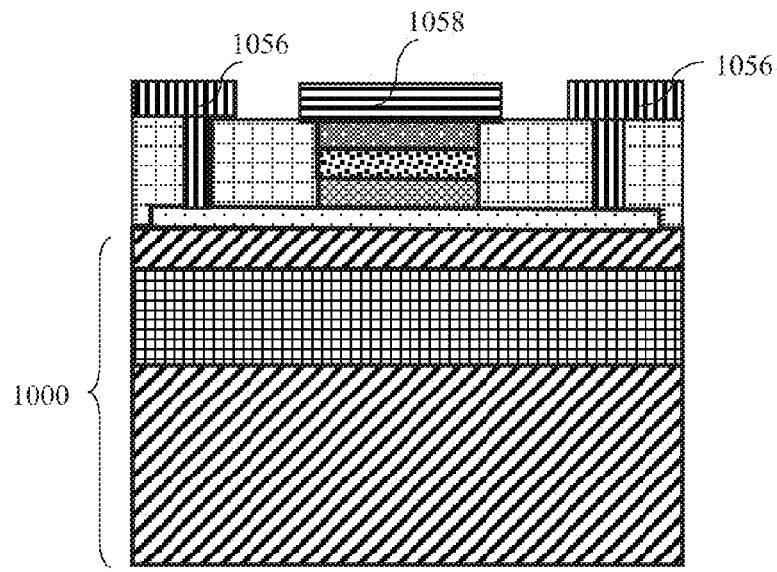
Figure 10J:
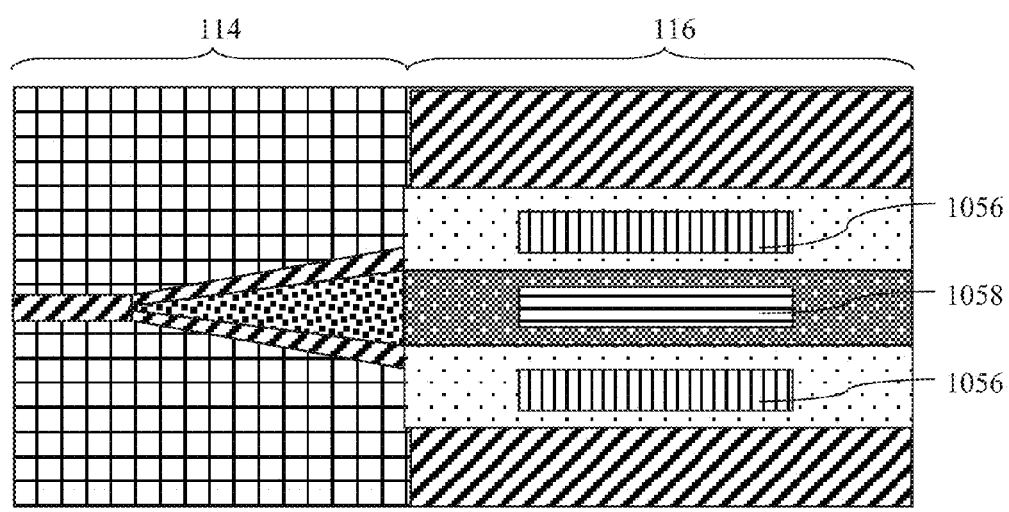
FIG. 10J depict a schematic diagram of a top view of fabricated the integrated laser at the coupler section and the active medium section fabricated by the fabrication method of FIGS. 10 to 10I.

FIGS. 10G to 10I schematically illustrate the passivation and metallization steps (corresponding to step 912 in FIG. 9). First, a layer of BCB 1050 of, e.g., about 2-3 um thickness is spinned onto the active III-V medium region 1030. For example, the BCB layer 1050 is cured inside a vacuum oven at 225° C. for 24 hrs to have a planarized surface profile. The BCB layer 1050 is then etched back as shown in FIG. 10G to expose the first contact layer (e.g., the p-contact layer) 1014 by using $CF_4+O_2$ gas chemistry in the RIE etching tool. To expose the second contact layer (e.g., n-contact layer) 1022, the BCB layer 1050 is patterned and etched again to form trenches 1052 as shown in FIG. 10H. Subsequently, a metallization process is performed to provide a good ohmic contact to the p- and n-III-V contact layers 1014, 1022, so that the integrated laser 100 can be pumped by injection electrical current. FIG. 10I schematically illustrates the n-contact metal 1056 and p-contact metal 1058 deposited by using E-beam evaporation and lift-off method. The top view schematic diagram of the coupler section 114 and the active medium section 116 of the integrated laser 100 fabricated by using the above exemplary fabrication method is shown in FIG. 10J.

Figure 11A:
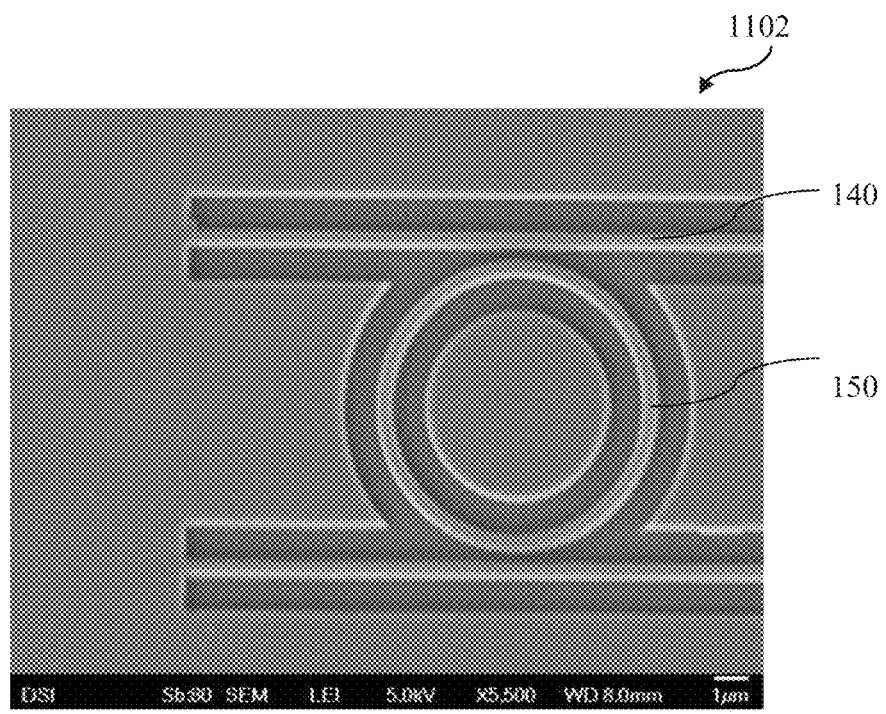
FIGS. 11A to 11C depict exemplary Scanning Electron Microscope (SEM) images of integrated laser at the emission wavelength control section, the coupler section, and the active medium section.
Figure 11B:
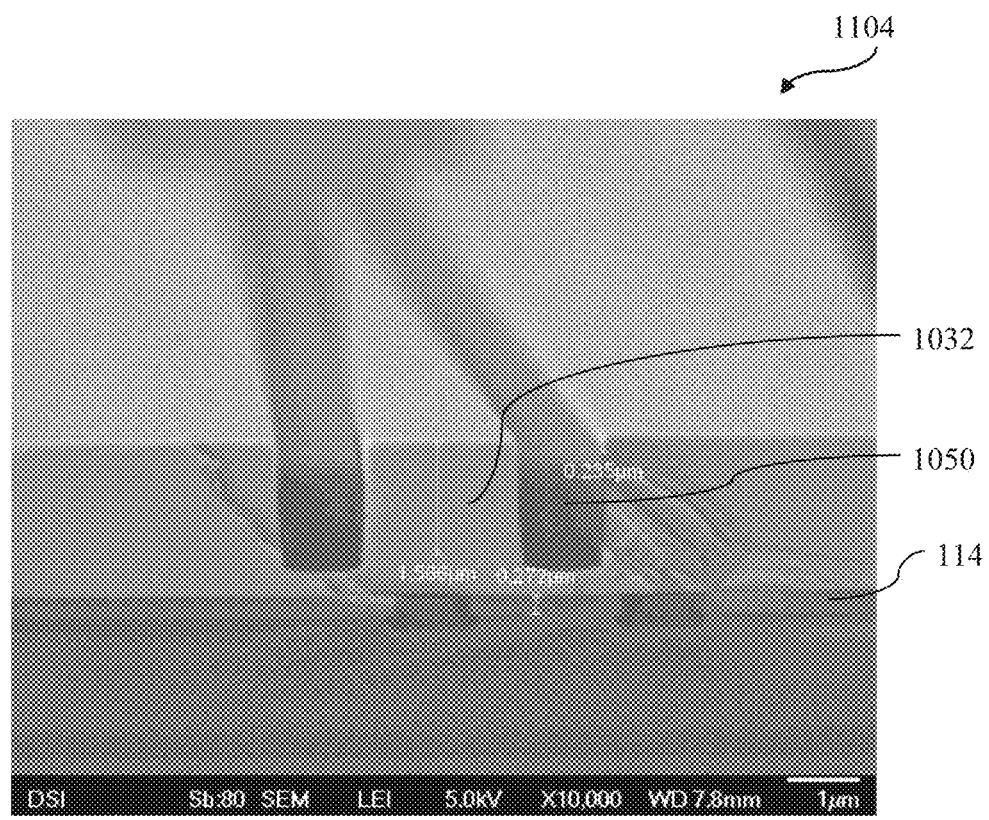
Figure 11C:
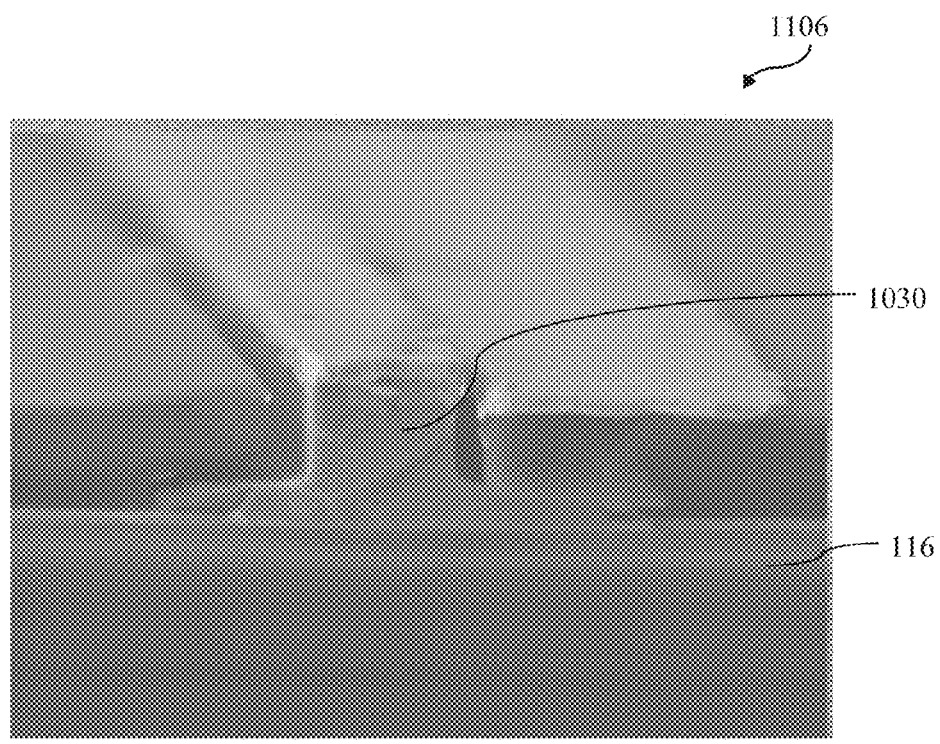

For illustration purposes only, FIGS. 11A to 11C depict exemplary Scanning Electron Microscope (SEM) images 1102, 1104, 1106 of the fabricated integrated laser 100 at the emission wavelength control section 112, the coupler section 114, and the active medium section 116, respectively.

Thus, according to embodiments of the present invention, there is provided an integrated laser 100 having emission wavelength control and unidirectional laser emission capabilities while being compact and simple in structure. The integrated tunable laser 500 and integrated tunable laser system 700 described herein are based on the integrated laser 100 and thus also possess the advantages of a simpler structure with a smaller footprint. Due to the simpler structure, the cost and complexity of the fabrication methods described herein are also advantageously reduced.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated laser, comprising:
   a semiconductor waveguide having a first section, a second section and a third section;
   an active region formed on the third section of the semiconductor waveguide, the active region configured for generating light; and
   a coupler formed on the second section of the semiconductor waveguide, the coupler configured for coupling said light between the semiconductor waveguide and the active region,
   wherein the first section comprises a multi-branch splitter having a ring structure formed between two branches of the multi-branch splitter for emission wavelength control of the integrated laser.

2. The integrated laser according to claim 1, wherein the multi-branch splitter is a Y-branch splitter and the ring structure is formed in a space between two branches of the Y-branch splitter.

3. The integrated laser according to claim 1, wherein the active region comprises III-V material layers formed on the third section of the semiconductor waveguide.

4. The integrated laser according to claim 3, wherein the III-V material layers include a single quantum well (SQW) or multiple quantum wells (MQW).

5. The integrated laser according to claim 1, wherein the coupler is an adiabatic coupler.

6. The integrated laser according to claim 5, wherein the adiabatic coupler has a tapered shape, tapering from an end adjacent the third section to an opposing narrower end adjacent the first section, and the adiabatic coupler comprises III-V material layers formed on the second section of the semiconductor waveguide.

7. The integrated laser according to claim 1, wherein the first section of the semiconductor waveguide functions as a narrow-band back mirror for filtering the emission wavelength, and the third section of the semiconductor waveguide has a cleaved facet that functions as a broad-band front mirror.

8. The integrated laser according to claim 1, wherein the first section of the semiconductor waveguide further comprises a tuning mechanism for modifying a property of the ring structure in order to tune the emission wavelength of the integrated laser.

9. The integrated laser according to claim 8, wherein the tuning mechanism comprises one or more electrodes coupled to the ring structure for modifying the property of the ring structure through heating or carrier injection for causing a change in the refractive index of the ring structure so as to tune the resonant wavelength of the ring structure.

10. An integrated tunable laser system, the system comprising:
    a plurality of integrated lasers, each integrated laser comprising:
       a semiconductor waveguide having a first section, a second section and a third section;
       an active region formed on the third section of the semiconductor waveguide, the active region configured for generating light; and
       a coupler formed on the second section of the semiconductor waveguide, the coupler configured for coupling said light between the semiconductor waveguide and the active region,
       wherein the first section comprises a multi-branch splitter having a ring structure formed between two branches of the multi-branch splitter for emission wavelength control of the integrated laser, and
    a wavelength de-multiplexing (WDM) element interfaced with a waveguide for combining laser light emitted by each of the plurality of integrated lasers,
    wherein the ring structures of the plurality of integrated lasers have different radii, each ring structure having a radius configured for tuning the emission wavelength of the respective integrated laser within a predetermined range of emission wavelengths.

11. The integrated tunable laser system according to claim 10, wherein each integrated laser is coupled in series with a respective ring modulator for converting an output of the integrated laser into an optical data.

12. The integrated tunable laser system according to claim 11, wherein each ring modulator is configured to have a predetermined number of resonant dips over an emission tuning range, and the system is configured for accommodating m×n optical channels, where m is the predetermined number of resonant dips of said each ring modulator and n is the number of integrated lasers in the system.

13. A method of fabricating an integrated laser, comprising:
    forming a semiconductor waveguide having a first section, a second section and a third section;
    forming an active region on the third section of the semiconductor waveguide, the active region configured for generating light; and
    forming a coupler on the second section of the semiconductor waveguide, the coupler configured for coupling said light between the semiconductor waveguide and the active region,
    wherein the first section comprises a multi-branch splitter having a ring structure formed between two branches of the multi-branch splitter for emission wavelength control of the integrated laser.

14. The method according to claim 13, wherein the multi-branch splitter is a Y-branch splitter and the ring structure is formed in a space between two branches of the Y-branch splitter.

15. The method according to claim 13, wherein forming the active region comprises forming III-V material layers on the third section of the semiconductor waveguide.

16. The method according to claim 15, wherein the III-V material layers include a single quantum well (SQW) or multiple quantum wells (MQW).

17. The method according to claim 13, wherein the coupler is an adiabatic coupler.

18. The method according to claim 17, wherein forming the coupler comprises forming the adiabatic coupler having a tapered shape, tapering from an end adjacent the third section to an opposing narrower end adjacent the first section, and forming the adiabatic coupler comprising III-V material layers on the second section.

19. The method according to claim 13, wherein the first section of the semiconductor waveguide functions as a narrow-band back mirror for filtering the emission wavelength, and the third section of the semiconductor waveguide has a cleaved facet that functions as a broad-band front mirror.

20. The method according to claim 13, further comprises forming a tuning mechanism at the first section of the semiconductor waveguide for modifying a property of the ring structure in order to tune the emission wavelength of the integrated laser.

21. The integrated laser according to claim 1, wherein the ring structure is configured to reflect said light received in the first section to the second section of the semiconductor waveguide.

* * * * *